US008866018B2

(12) United States Patent
Pramanik et al.

(10) Patent No.: US 8,866,018 B2
(45) Date of Patent: Oct. 21, 2014

(54) PASSIVE ELECTRICAL DEVICES AND METHODS OF FABRICATING PASSIVE ELECTRICAL DEVICES

(75) Inventors: Pranabes K. Pramanik, Clifton Park, NY (US); Yuji Kageyama, Clifton Park, NY (US); Fujio Kuwako, Clifton Park, NY (US); Jin Hyun Hwang, Clifton Park, NY (US)

(73) Assignee: Oak-Mitsui Technologies LLC, Hoosick Falls, NY (US)

( * ) Notice: Subject to any disclaimer, the term of this patent is extended or adjusted under 35 U.S.C. 154(b) by 722 days.

(21) Appl. No.: 12/352,411

(22) Filed: Jan. 12, 2009

(65) Prior Publication Data
US 2010/0175914 A1 Jul. 15, 2010

(51) Int. Cl.
H01B 7/08 (2006.01)
H01G 4/18 (2006.01)
H01G 4/20 (2006.01)
H01G 4/33 (2006.01)
H05K 1/16 (2006.01)

(52) U.S. Cl.
CPC .......... H01G 4/18 (2013.01); H01G 4/203 (2013.01); H01G 4/33 (2013.01); H05K 1/162 (2013.01); H05K 2201/0166 (2013.01); H05K 2201/0195 (2013.01); H05K 2201/0355 (2013.01); H05K 2201/09309 (2013.01)
USPC .................................................. 174/117 FF

(58) Field of Classification Search
USPC ........................................ 174/256, 117 FF
See application file for complete search history.

(56) References Cited

U.S. PATENT DOCUMENTS

| 4,314,231 A | 2/1982 | Walty |
| 4,799,127 A | 1/1989 | Ono et al. |
| 4,854,936 A | 8/1989 | Ono et al. |
| 5,362,534 A | 11/1994 | McKenney |
| 5,516,983 A | 5/1996 | Kishimoto |
| 5,557,843 A | 9/1996 | McKenney |
| 5,679,230 A | 10/1997 | Fatcheric |
| 5,852,397 A | 12/1998 | Chan et al. |

(Continued)

FOREIGN PATENT DOCUMENTS

| CN | 1256499 A | 6/2000 |
| JP | 09-254308 | 9/1997 |
| JP | 2007-115723 | 5/2007 |

OTHER PUBLICATIONS

International Report on Patentability for corresponding PCT application No. PCT/US2010/020620, mailed Jul. 21, 2011.

(Continued)

*Primary Examiner* — Chau N Nguyen
(74) *Attorney, Agent, or Firm* — Heslin Rothenberg Farley & Mesiti P.C.

(57) ABSTRACT

A thin laminate passive electrical device, such as, a capacitor, and a method of fabricating a thin laminate passive electrical device are provided. The passive electrical device includes two conductors, for example, copper foil conductors, separated by a dielectric having a first layer of a first material having a softening point temperature greater than a first temperature and a first layer of a second material having a softening point temperature less than the first temperature. The first temperature may be at least 150 degrees C. or higher. By providing a first layer having a higher softening point material, shorting across the conductors, that can be promoted by the fabrication process, is prevented. Methods of fabricating passive electrical devices are also disclosed.

16 Claims, 7 Drawing Sheets

(56) References Cited

U.S. PATENT DOCUMENTS

| | | |
|---|---|---|
| 5,933,315 A | 8/1999 | Yamana |
| 6,212,062 B1 | 4/2001 | Day et al. |
| 6,274,224 B1 | 8/2001 | O'Bryan |
| 6,547,990 B2 | 4/2003 | Shinozaki et al. |
| 6,551,433 B2 | 4/2003 | Kuwako et al. |
| 6,618,238 B2 | 9/2003 | Sanville, Jr. |
| 6,657,849 B1 | 12/2003 | Andresakis et al. |
| 6,693,793 B2 | 2/2004 | Kuwako et al. |
| 6,709,702 B2 * | 3/2004 | Nakano et al. ............... 427/250 |
| 6,917,272 B2 | 7/2005 | Valdemarsson |
| 7,192,654 B2 | 3/2007 | Andresakis et al. |
| 7,413,815 B2 | 8/2008 | Pramanik |
| 2003/0072129 A1 | 4/2003 | Kuwako et al. |
| 2003/0213615 A1 | 11/2003 | Utsumi et al. |
| 2004/0128822 A1 * | 7/2004 | Tung ............................ 29/592.1 |
| 2006/0185140 A1 * | 8/2006 | Andresakis et al. ......... 29/25.41 |
| 2006/0188701 A1 * | 8/2006 | Andresakis et al. .......... 428/209 |
| 2008/0002331 A1 | 1/2008 | Ogiwara |
| 2009/0068453 A1 * | 3/2009 | Chung .......................... 428/337 |

OTHER PUBLICATIONS

International Search Report and Written Opinion for corresponding PCT application No. PCT/US2010/020620 mailed Jul. 28, 2010.

* cited by examiner

PASSIVE ELECTRICAL DEVICES AND METHODS OF FABRICATING PASSIVE ELECTRICAL DEVICES

BACKGROUND OF THE INVENTION

1. Technical Field

This invention relates to thin laminate passive electrical devices and methods of fabricating thin laminate passive electrical devices, such as, capacitors. More particularly, this invention relates to thin laminate passive electrical devices having a relatively rigid dielectric material between opposing conductors that minimizes or prevents electrical shorts between the conductors due to the fabrication process.

2. Description of Related Art

The printed circuit board (PCB) industry has a tremendous need for thin, copper-clad laminates for reducing real estate on the board and improving performance and functionality of electronic devices. The use of thin laminates as a capacitor in PCBs not only reduces PCB real estate, resulting in smaller size devices, but can also increase electrical performance of the final product. For example, an increase in electrical performance may include decoupling devices and lowering electrical noise characteristics. The challenge in the art is to make a very thin laminate devices having high electrical voltage resistance and shorting resistance as well other desired electrical, mechanical, and thermal properties. Aspects of the present invention can meet these needs by providing thin laminates for use in PCBs having a composite polymer-layer structure having improved electrical, mechanical, and thermal properties.

The disadvantages of the existing art can be illustrating with the aid of FIGS. 1-4. FIG. 1 is an exploded schematic illustration of the components that are found in a passive electrical device, for example, a capacitive laminate, according to the existing art. As shown in FIG. 1, a typical passive device may include two conductive foil, typically, copper, substrates 12 and 14 separated by a thin layer of insulating material 16, for example, a polymer, such as, an epoxy polymer. FIG. 2 is a schematic illustration of the typical lamination of foils 12, 14 with insulating material 16 under pressure and temperature resulting in a laminated passive electrical device 18.

However, close examination of the interface between the laminated foils 12 and 14, and the insulation 16 shown schematically in FIG. 3, which represents the detailed view 3 shown in FIG. 2, illustrates the recognized disadvantages of such a prior art lamination and lamination process. As shown in FIG. 3, due to the inherent unevenness or presence of asperities or peaks 20 on the surfaces of the conductive foils 12, 14, the desired separation between foils 12, 14, even with the presence of the insulation material 16, can be compromised, as indicated by the contacting peaks identified at point A. This diminished or non-existent separation between the foils 12 and 14 can be the source of electrical shorts between the foils 12 and 14 as evidence by failure of the passive device, for example, a capacitor, to provide its desired function. Accordingly, many attempts have been made in the art to minimize or eliminate contact between foils 12, 14.

One direction taken in the prior art is to provide a smooth a surface to the foils 12 and 14 as possible to minimize the number of asperities 20 that can provide potential shorting. For example, the laminates disclosed in U.S. Pat. No. 6,274, 224 assigned to 3M Innovative Properties Company, provide surface finishes on conductive foils to 300 nanometers (nm) and lower. In a successful attempt to address this issue, the inventors of U.S. Pat. No. 6,693,793 of Mitsui Mining & Smelting Co., Ltd. introduced an intermediate film to minimize or prevent the potential for failure due to shorting.

Another disadvantage of prior art laminations and laminating methods can be the susceptibility to damage due to the presence of foreign matter or debris in the lamination process. Though typically practiced under extremely clean environments, for example, in "clean rooms," the presence of minute contaminants or debris can interfere with the performance of the passive electrical device. An example of one such disadvantage is shown in FIG. 4.

FIG. 4 is a schematic illustration of a detailed view of the interface between conductive foils 22, 24 and an insulating layer 26 according to the prior art. As indicated schematically by foreign body or debris 28, during lamination, that is, under temperature and pressure, in this case, as indicated by arrows 30, the presence of foreign body 28 can result in uneven localized compression and localized deflection of one or both of the foils 22, 24. Typically, since the insulating layer 26 experiences a reduction in viscosity due to the elevated temperature at which lamination takes places, that is, at a temperature of at least 150 degrees C., under the influence of the localized pressure gradient, the insulating layer 26 may flow away from localized areas due to the uneven pressure and deflection caused by the presence of foreign body 28. As a result, there may be little or no resistance to localized deflection of the foils, which may result in undesirable reduction or elimination of the desired spacing between foils 22, 24, as indicated by the contacting peaks identified at point B in FIG. 4. Again, the diminished or non-existent separation between the foils 22 and 24 can be another source of electrical shorts between the foils 22, 24 as evidence by failure of the passive device. As will be apparent from the description below, aspects of the present invention also address this disadvantage of the prior art.

SUMMARY OF ASPECTS OF THE INVENTION

According to aspects of the present invention, passive electrical devices, for example, a capacitor, and methods of fabricating a passive electrical device are provided that overcome the disadvantages of the prior art. According to aspects of the invention, passive electrical devices and methods of fabricating passive electrical devices are provided in which a layer of insulating material is introduced between the conductive foils that provides a barrier to contact between the foils while providing an insulating material that is not susceptible to flow under the influence of localized pressure gradients when exposed to the heat and pressure that characterize the typical fabrication, for example, lamination, process.

Aspects of the present invention provide laminate structures that can be used for a passive electrical device, for example, as a capacitor, that may be mounted on or embedded in a printed circuit board (PCB). Aspects of the invention include a laminate and a method of fabricating a laminate having at least a three-layer structure comprising two copper foils mounted on either side of a dielectric material layer. As will be discussed more fully below, one way of manufacturing the laminate is by joining copper foil on both sides of a polymer material which functions as a dielectric. The laminate properties (that is, the electrical, mechanical, and thermal properties) may typically be dependent on the lamination process, the characteristics of the polymer or polymer layers, and the copper foils. Aspects of the present invention address the challenge of manufacturing a passive electrical device laminate while minimizing or preventing shorting and/or having low electrical voltage resistance for use in printed circuit boards. Aspects of the invention employ one or more unique composite-polymer layer structures to provide the desired properties and electrical performance, for example, resistance to shorting and high electrical voltage resistance, among other improved properties.

One aspect of the present invention is a passive electrical device having a first conductor; a first layer of a first material adjacent to the first conductor, the first material having a softening point temperature greater than a first temperature; a first layer of a second material adjacent to the first layer of first material, the second material having a softening point temperature less than the first temperature; and a second conductor adjacent the first layer of the second material. In one aspect, the passive electrical device comprises a thin laminate electrical device. In another aspect, the first temperature may be 150 degrees C., or 175 degrees C., or 200 degrees C., or even 300 degrees C., for example, depending upon, as will be discussed below, the temperature of the fabrication process. For example, the first temperature may be the lamination temperature, that is, the temperature at which the lamination is practiced. The first material and the second material may be a monomer, an oligomer, or a polymer, or a mixture thereof, for example, a thermoplastic polymer or a thermosetting polymer.

Another aspect of the invention is a method of fabricating a passive electrical device, the method including applying a first layer of a first material to a first conductor, the first material having a softening point temperature greater than a first temperature; applying a first layer of a second material to the first layer of the first material, the second material having a softening point temperature less than the first temperature; and laminating a second conductor to the first layer of the second material at a temperature less than the first temperature. Again, in one aspect, the first temperature may be 150 degrees C. or higher.

A further aspect of the invention is a thin laminate capacitive device including a first copper foil conductor; a first layer of a first polymer having a softening point temperature greater than 150 degrees C. bonded to the first copper foil conductor; a first layer of a second polymer having a softening point temperature less than 150 degrees C. bonded to the first layer of the first polymer; and a second copper foil conductor bonded to the first layer of the second material; wherein the capacitive device comprises a capacitance density of at least about 50 pF/cm2 and a dielectric strength of at least about 200 kV/mm. In one aspect, the first polymer may be a polyamide. In another aspect, the second polymer may be an epoxy.

A still further aspect of the invention is a printed circuit board or an electrical device having one or more of the passive electrical devices described above.

Details of these aspects of the invention, as well as further aspects of the invention, will become more readily apparent upon review of the following drawings and the accompanying claims.

BRIEF DESCRIPTION OF THE FIGURES

The subject matter that is regarded as the invention is particularly pointed out and distinctly claimed in the claims at the conclusion of the specification. The foregoing and other objects, features, and advantages of the invention will be readily understood from the following detailed description of aspects of the invention taken in conjunction with the accompanying drawings in which:

DETAILED DESCRIPTION OF ASPECTS OF THE INVENTION

Figure 5:
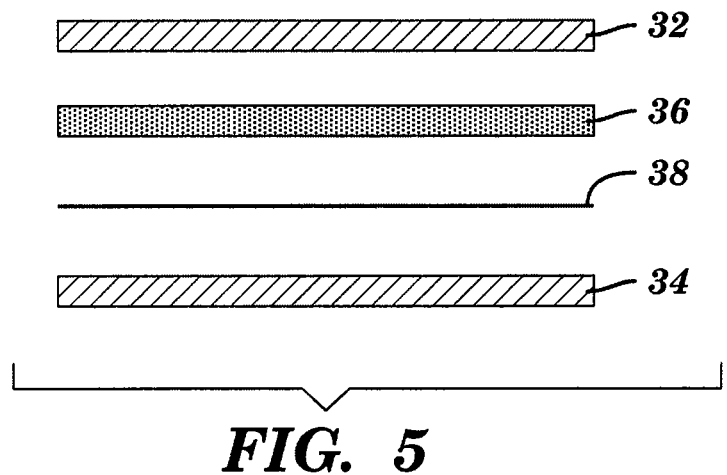
FIG. 5 is an exploded schematic illustration of the components of a passive electrical device according to one aspect of the present invention.

The details and scope of the aspects of the present invention can best be understood upon review of the attached figures and their following detailed descriptions. FIG. 5 is an exploded schematic illustration of the components of a passive electrical device according to one aspect of the present invention. As shown in FIG. 5, one aspect of the invention includes two conductive substrates, foils, or simply conductors, typically, copper foils, 32 and 34 separated by a first layer of insulating or dielectric material 36 and a second layer of insulating or dielectric material 38. The conductive substrate, foils, or conductors 32, 34 may comprise any electrically conductive material, but may typically be made from an electrically conductive metal, for example, copper, nickel, aluminum, zinc, brass, steel, stainless steel, gold, silver, titanium or a combination thereof, or any other electrically conductive metal. According to aspects of the invention, the substrates, foils, or conductors 34, 36 may typically have thicknesses ranging between about 3 microns (μm) to about 200 μm, for example, a thickness of between about 3 μm and about 70 μm, and have a surface roughness ($R_z$) of about 0.5 μm to about 5 μm.

In one aspect, the conductors 32 and 34 are copper foils, for example, rolled foils or electrodeposited foils. Copper foil conductors 32 and 34 may be produced by electrodepositing copper from solution, for example, onto a rotating metal drum immersed in the solution, as is well known in the art. Typically, the side of the foil next to the drum (that is, the "drum side") is a smooth and shiny side, while the other side (the "matte side") has a relatively rough, non-shiny surface.

In one aspect, the surface of conductors 32 and 34 may be modified to enhance adhesion to adjacent layers, for example, by micro-etching or electrolytical treatment to deposit micronodules of a metal or metal alloy on or in the surface. These nodules may preferably be a copper or a copper alloy that increases adhesion to the adjacent polymer, as described in U.S. Pat. No. 5,679,230, the disclosure of which is incorporated by reference herein. The surfaces of the conductors 32 and/or 34 may or may not be treated with an amino silane or an epoxy silane coupling agent, or with a similar coupling agent.

According to aspects of the invention, the first layer 36 of insulating material comprises an insulating material capable of bonding to at least conductor 34 and having a high thermal deformation resistance, that is, a resistance to deform, displace, or flow. For example, first layer 36 may be a material having stiffness and dimensional stability under the temperatures and pressures typically experienced during fabrication, for example, during a lamination process, for instance, at least 150 degrees C. and at least 3.5 kilograms per square centimeter ($kg/cm^2$) (that is, about 50 pounds per square inch (psi)). For example, the first layer 36 may be a material having a "softening point," greater than the temperature experienced during fabrication, for example, during lamination, for instance, a softening point temperature of at least about 150 degrees C. As is known in the art, the "softening point" of a material is the temperature, in Celsius, at which a material, for example, a polymer, typically begins to soften. According to one aspect, the softening point of the material of layer 36 may comprise the softening point before treatment, for example, before heating during lamination, wherein the softening point may vary with treatment. In another aspect, the softening point of the material of layer 36 may comprise a softening point before treatment, for example, before heating during lamination, wherein the softening point may be substantially the same after treatment. Several industry standards exist for determine softening point temperatures of polymers, including the Vicat softening point determined as recited in ASTM D 1525 or ISO 306 or the heat deflection temperature (HDT) defined by ASTM D 648, which establishes a HDT at 1.82 MegaPascals (MPa) of applied pressure. In one aspect of the invention, the material of layer 36 may have a softening point of at least 150 degrees C., but may also be at least 175 degrees C., or at least 200 degrees C., or even at least 300 degrees C., for instance, depending upon the temperature to which layer 36 is exposed to during fabrication, for example, during lamination. For example, the lamination temperature may be about 210, 220, 230, or 250 degrees C. The thickness of first layer 36, when at least partially cured, may range from about 1.5 μm to about 25 μm.

"Softening point temperature" should not be confused with "glass transition temperature." As is known in the art, glass transition temperature ($T_g$) is the temperature at which an amorphous solid, such as, a polymer, becomes brittle on cooling. Typically, the softening point temperature, $T_s$, is greater than $T_g$ and less than the melting point temperature ($T_m$) of a polymer, which may encompass a range of temperatures. As is known in the art, as the temperature of a polymer is increased, at the $T_g$ molecular vibrations begin, but the polymer typically does not soften or flow. However, at the $T_s$, the polymer molecules begin to separate allowing softening and flow of the polymer.

According to aspects of the invention, the first layer 36 may be a high-temperature-resistant thermoplastic polymer, a high-temperature-resistant thermosetting polymer, or a combination of a high-temperature-resistant thermoplastic and a high-temperature-resistant thermosetting polymer. That is, layer 36 may be one or more polymers having excellent deformation resistance under the pressure and heat typically experienced during a lamination process. For example, according to aspects of the invention, the first layer 36 may be selected from the class of thermoplastic or thermosetting polymers including polyamides, polyamide-imides, polyimides, polyether sulphones, polyaryl sulfone, polyphenylene sulfide, polyetheretherketones, polyphenylenesulphides, polyphenyleneoxides, polybismalimides, epoxies, polyesters, polyurethane, blends thereof, or their equivalents.

The second layer 38 in FIG. 5 may be a material that is capable of somehow bonding to at least the first layer 36, but may also be capable of bonding to a conductor 32, 34. In one aspect, the second layer 38 may comprise a first layer of a second material, for example, a polymer, for instance, different from the polymer of the first layer 36. According to aspects of the invention, and as used herein, the expression "capable of bonding" means somehow reacting or cross linking with an adjacent material, for example, at the lamination temperature and pressure, whereby a bond, for example, a mechanical bond, a chemical bond, or a combination thereof, is provided between the material, for example, second layer 38, and its adjacent layer or layers, for example, first layer 36 and conductor 34. As will be discussed below, layer 38 may also be capable of bonding to a second material substantially the same as the material of the layer 36. The thickness of layer 38, when at least partially cured, may range from about 0.5 μm to about 25 μm. According to aspects of the invention, layer 38 may be one or more thermosetting polymers, or a blend of one or more thermoplastics and one or more thermosetting polymer capable of bonding with at least first layer 36, and conductor 34. For example, the material of second layer 38 may be selected from the following groups of polymers, including epoxies, polyimides, polyamides, polyamideimides, polyethersulfones, polyesters, polybismalemides, alkyd, polyurethane, bismalemide triazine, and mixtures thereof.

In one aspect of the invention, the material of layer 38 may deform under lamination temperature and pressure. For example, according to one aspect of the invention, unlike the material of first layer 36, the material of layer 38 may comprise a material that does not have high thermal deformation resistance. For example, the material of layer 38 may not be resistant to deform or flow under the temperatures and pressures typically experienced during fabrication, for example, during lamination, for instance, at least 150 degrees C. and at least 3.5 $kg/cm^2$ (that is, about 50 psi). In one aspect, the material of second layer 38 may have a softening point less than the softening point of the material of first layer 36, as defined by the industry standards referenced above. For instance, the softening point of the material of second layer 38 may be at least 5 percent less than the softening point temperature of the material of first layer 36, or at least 10 percent less, or even at least 20 percent less than the softening point temperature of the material of the first layer 36. For instance, the material of second layer 38 may be a material having "softening point" of less than about 150 degrees C., or less than about 120 degrees C., or even less than about 100 degrees C., as defined by the industry standards referenced above.

First layer 36 and second layer 38 may or may not contain additives or fillers, that is, materials that somehow enhance the electrical and/or mechanical properties of layers 36 and/or 38 or the electrical and/or mechanical properties of the passive electrical device. The filler material may comprise organic or inorganic filler material, or mixtures thereof The filler material may comprise insulating particles, semiconducting particles, ferroelectric particles, or mixtures thereof The filler particles may comprise silicon dioxide, boron nitride, titanium dioxide, silicon carbide, mica, organic fillers, and/or ceramic materials, or mixtures thereof The ceramic materials may comprise barium titanate, strontium titanate, barium lead titanate, barium strontium titanate, barium neodymium titanate, aluminum trioxide, calcium titanate, strontium zirconium titanate, barium calcium titanate, calcium zirconium titanate, and mixtures there of The particles may typically be homogeneously mixed with the material of layer 36 and/or 38, for example, homogeneously mixed with the polymer matrix of layer 36 and/or 38. The filler particles may have average particle sizes less than 10 microns (μm), or even less than 3 μm, for further enhancing the electrical and mechanical properties of composite layers. The particles may be provided in the form of balls, rods, fibers, flecks, and/or whiskers, or combinations thereof In one aspect of the invention, layer 36 and/or layer 38 may be include filler materials, for example, particles, present in an amount of from about 1% to 80% by volume, for example, from about 5% to about 50% by volume of the layer.

Figure 6:
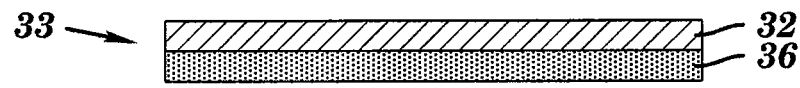
FIGS. 6, 7, 8, and 9 are schematic illustrations of the steps in the process of fabricating a passive electrical device according to one aspect of the invention.

FIGS. 6, 7, 8, and 9 are schematic illustrations of the steps in the process of fabricating a passive electrical device according to one aspect of the invention. As shown in FIG. 6, according to aspects of the invention, the first layer 36 may be applied to conductor 32 to provide a coated conductor 33, for example, a coated copper foil conductor or a resin coated copper foil. Though first layer 36 may be applied to conductor 32 by any conventional means, for example, coating, laminating, electrodeposition, among other means, according to one aspect of the invention, first layer 36 may be applied to conductor 32 by coating. For example, first layer 36 may be applied to conductor 32 by coating a liquid solution or mixture of a polymer, an oligomer, and/or a monomer and a solvent onto conductor 32. The polymer, oligomer, and/or monomer may be one or more of the polymers, oligomers, and/or a monomers referenced above. The solvent may be any conventional solvent, including dimethylacetamide, n-methylpyrrolidone, dimethylformamide, methyleethyleketone, toluene or a mixture there of. Though coating will be presented as one method of fabricating aspects of the invention, it should be understood that aspects of the invention may be provided by non-coating methods, for example, by electrodeposition, by applying a polymer layer or film, or by extruding a polymer onto the surface of conductor 32.

Coating may be practiced continuously, for example, by continuous coating of a conductor foil by applying a continuous layer of dielectric. A metering device may be used to coat layer 36 on conductor 32, such as, a doctor blade, a slot-die, a reverse roll, a gravure roll, a lip die, a comma die, or other conventional method to control the thickness of the layer 36. In one aspect, if the polymer solution comprises a thermoplastic polymer, the layer 36 may be substantially completely dried.

According to aspects of the invention, after applying the first layer 36 to conductor 32, for example, by coating, the coated conductor 33 may be heated to evaporate at least some of the solvent and at least partially cure or dry the material of layer 36 to produce a laminated structure 35 of conductor 32 and an at least partially cured layer 36 or, when the coating solution comprises a thermoplastic polymer, a dried layer 36, for example, a substantially completely dried thermoplastics polymer layer 36. In one aspect, the uncured or undried, coated conductor 33 may be passed through an oven at a temperature above the boiling point of the solvent so that substantially all the solvent is effectively removed from layer 36 and the material of layer 36 is at least partially cured. In one aspect, during heating, the material of layer 36 may be substantially totally cured.

Figure 7:
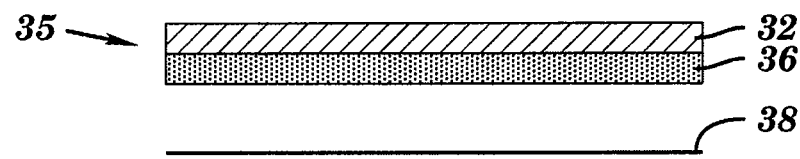

As shown in FIG. 7, after at least partially curing the material of layer 36, the second layer 38 is applied to the first layer 36 of the laminated structure 35. In a process that may be similar to the process described above, according to aspects of the invention, the second layer 38 may be applied to first layer 36 of laminate structure 35 by coating to provide a double insulated layer coated conductor 37, for example, a double-coated copper foil conductor. Again, though second layer 38 may be applied to first layer 36 by any conventional means, according to one aspect of the invention, second layer 38 may be applied to first layer 36 by coating, for example, coating a liquid mixture of a polymer, an oligomer, and/or a monomer in a solvent onto first layer 36. The polymer, oligomer, and/or monomer may be one or more of the polymers, oligomers, and/or monomers referenced above. The solvent may be any conventional solvent, including one or more of the solvents mentioned above.

According to aspects of the invention, after applying the second layer 38 to first layer 36, for example, by coating, the double coated conductor 37 may be heated to evaporate at least some of the solvent and partially cure the material of layer 38 to produce a laminated structure 37 of conductor 32, partially cured layer 36, and partially cured layer 38. In one aspect, the uncured, double-coated conductor 37 may be passed through an oven at a temperature above the boiling point of the solvent so that substantially all the solvent is effectively removed from layer 38 and the material of layer 38 is partially cured. The resulting total thickness of dielectric layers 36 and 38, as at least partially cured, may be between about 3.5 μm to about 100 μm.

Figure 8:
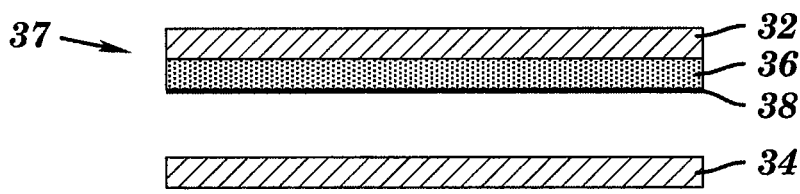
Figure 9:
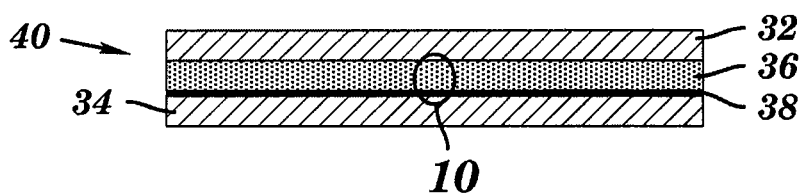

As shown in FIG. 8, after at least partially curing the material of layer 38, the second conductor 34 may be applied to the double-coated laminate 37 to produce the laminated passive electrical device 40 shown in FIG. 9. The second conductor 34, for example, a copper foil, may be applied to double-coated laminate 37 by conventional means, for example, by lamination. According to aspects of the invention, lamination may be practiced under pressure and at temperature. For example, lamination may be practiced in a press at a temperature of from about 140 degrees C. to about 310 degrees C., for example, from about 160 degrees C. to 200 degrees C. The lamination pressure may be from about 3.5 kilograms per square centimeter (kg/cm$^2$) (that is, about 50 pounds per square inch (psi)) to about 42.3 kg/cm$^2$ (that is, about 600 psi), and typically may be from about 10 kg/cm$^2$ (that is, about 142 psi) to about 25 kg/cm$^2$ (that is, about 355 psi). The duration of the lamination process may vary from about 30 minutes to about 180 minutes, for example, from about 50 minutes to about 90 minutes. The lamination process may be practiced under vacuum or without vacuum. For example, when practiced under vacuum, a vacuum pressure of at least 70 centimeters (that is, about 28 inches) of mercury (Hg) absolute pressure may be used.

Figure 2:
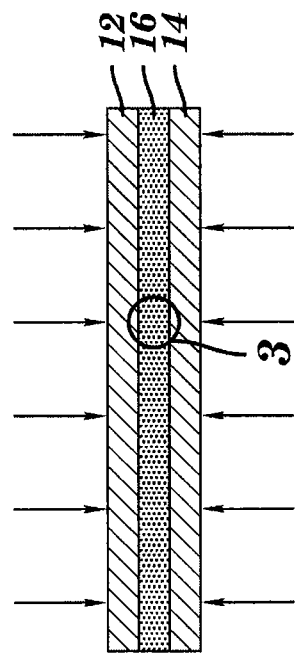
FIG. 2 is a schematic illustration of the typical lamination of foils with an insulating material under pressure and temperature according to the prior art.
Figure 1:
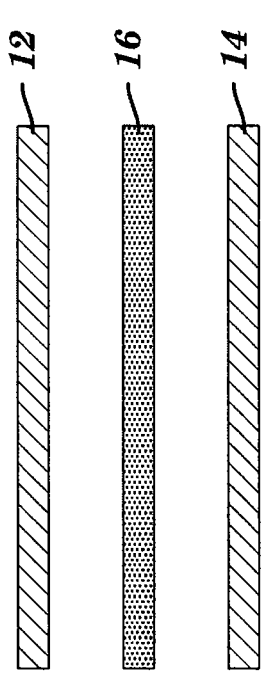
FIG. 1 is an exploded schematic illustration of the components found in a passive electrical device according to the prior art.
Figure 4:
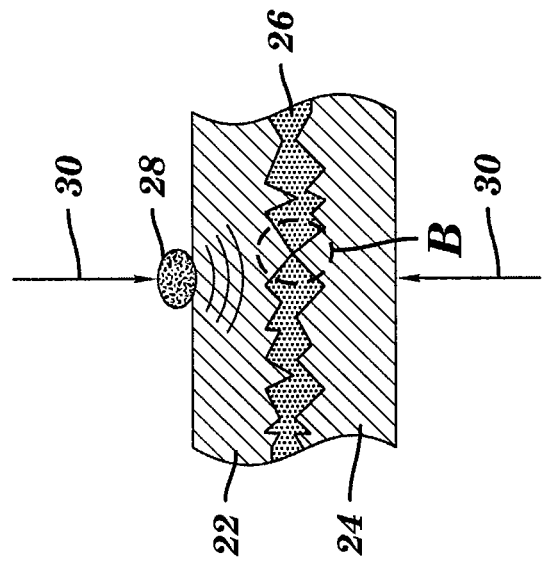
FIG. 4 is a schematic illustration of a detailed view of the interface between conductive foils and an insulating layer when a foreign body is present during lamination according to the prior art.
Figure 3:
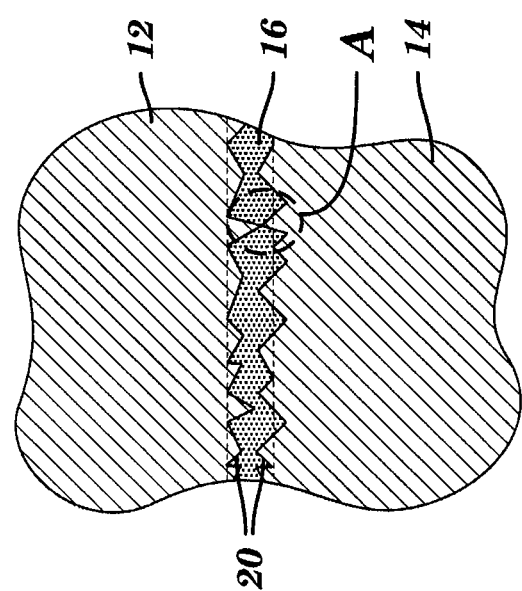
FIG. 3 is a detailed view of a portion of the laminate shown in FIG. 2 as identified by detail 3 shown in FIG. 2.

According to one aspect of the invention, the lamination process depicted in FIGS. 8 and 9 may be practiced at a temperature less than the softening point temperature of the material of layer 36. For example, the lamination of conductor 34 onto laminate 37 may be practiced at a temperature that minimizes or prevents the displacement or flow of the material in layer 36 whereby the desired separation between conductors 32 and 34 is maintained, and shorting across conductors 32 and 34, as shown schematically in FIGS. 3 and 4, is minimized or prevented.

Figure 10:
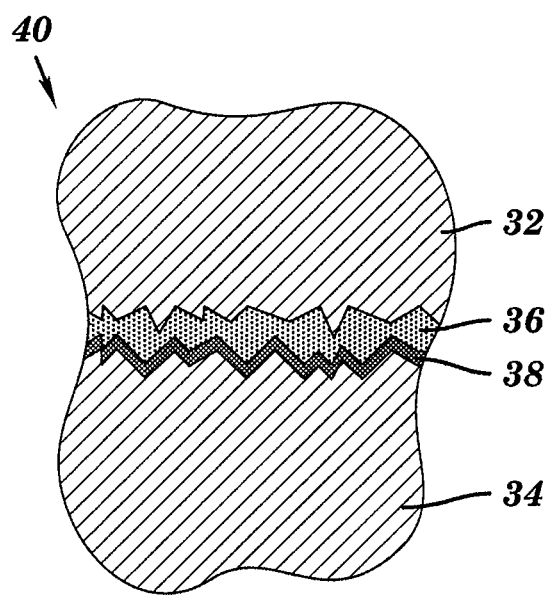
FIG. 10 is a detailed view of a portion of the laminate shown in FIG. 9 as identified by detail 10 shown in FIG. 9.

FIG. 10 is a detailed view of a portion of the laminate passive electrical device 40 shown in FIG. 9, as identified by detail 10 shown in FIG. 9. As shown in FIG. 10, according to aspects of the invention, providing a layer 36 of a material having a softening point temperature greater than the processing temperature experienced during fabrication, for example, during lamination, prevents displacement of material in layer 36 whereby contact between conductors 32 and 34 is minimized or eliminated. As shown in FIG. 10, according to aspects of the invention, a more reliable passive electrical device, for example, a capacitor, may be provided. In contrast to the prior art, without the presence of the relatively rigid layer 36, during fabrication, for example, under lamination pressure and temperature, electric shorting is unlikely to occur between conductors 32 and 34, even when undesirable debris is present during lamination (as shown FIG. 4). Aspects of the present invention minimize or prevent the occurrence of electrical shorting.

Figure 11:
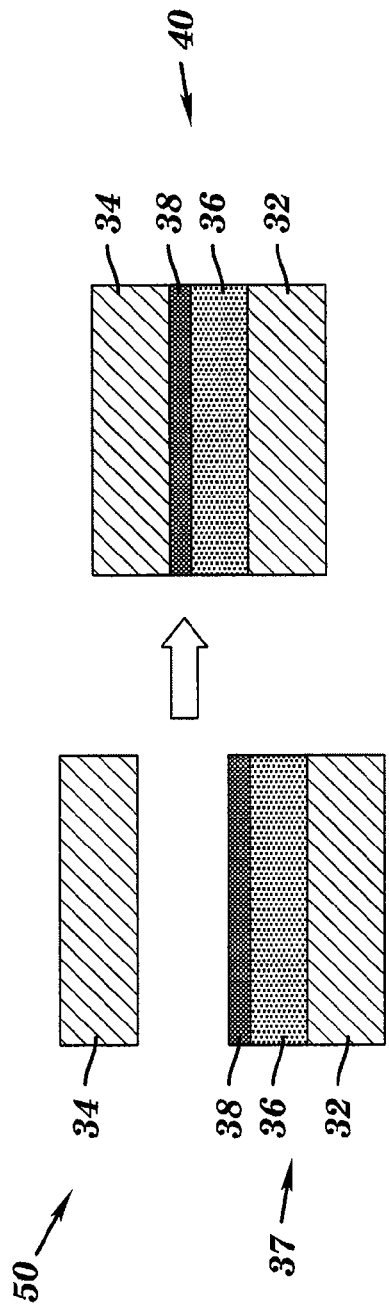
FIG. 11 is a schematic diagram of a process for fabricating a passive electrical device according to an aspect of the invention.

FIG. 11 is a schematic diagram of a process 50 for fabricating a passive electrical device 40 according to an aspect of the invention. Process 50 is similar the process illustrated in FIGS. 5-9 described above. As shown in FIG. 11, double-coated structure 37 having conductor 32, first layer 36, and second layer 38 may be laminated under temperature and pressure, as discussed above, with conductor 34 to produce a laminated passive electrical device 40. Aspects of the invention include process 50 and passive electrical device 40 having two dielectric layers, for example, distinct dielectric layers, 36 and 38 positioned between conductors, for example, foil conductors, 32 and 34.

Figure 12:
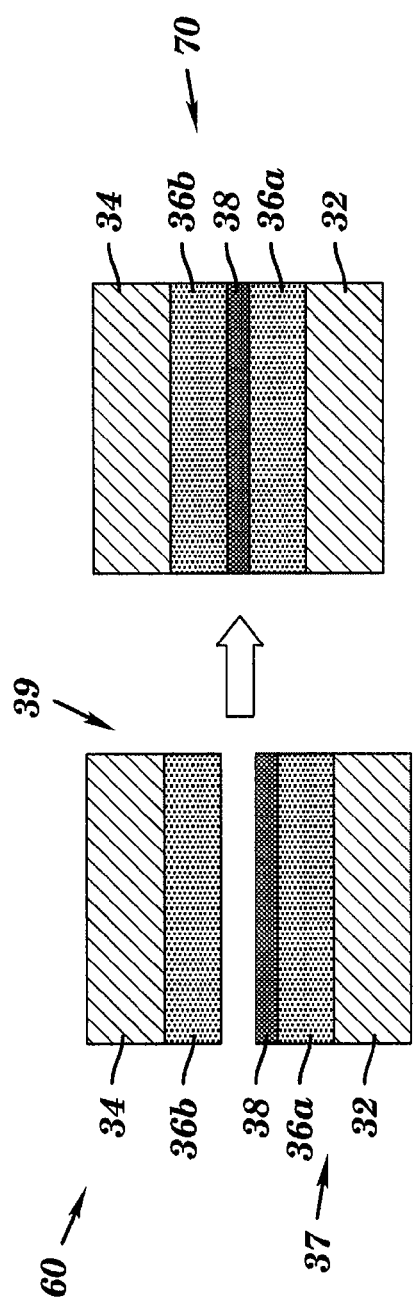
FIG. 12 is a schematic diagram of another process for fabricating a passive electrical device according to an aspect of the invention.

FIG. 12 is a schematic diagram of another process 60 for fabricating a passive electrical device 70 according to an aspect of the invention. As shown in FIG. 12, process 60 includes a double-coated laminate structure 37 having conductor 32, first layer 36a (which may be similar to or identical to first layer 36 described above), and second layer 38 which may be laminated under temperature and pressure, as discussed above, with a single-coated laminate structure 39 having conductor 34 and layer 36b (which may be similar to or identical to first layer 36 described above) to produce laminated passive electrical device 70. Aspects of the invention include process 60 and passive electrical device 70 having three dielectric layers, for example, distinct dielectric layers, 36a, 38, and 36b, positioned between conductors, for example, foil conductors, 32 and 34.

Figure 13:
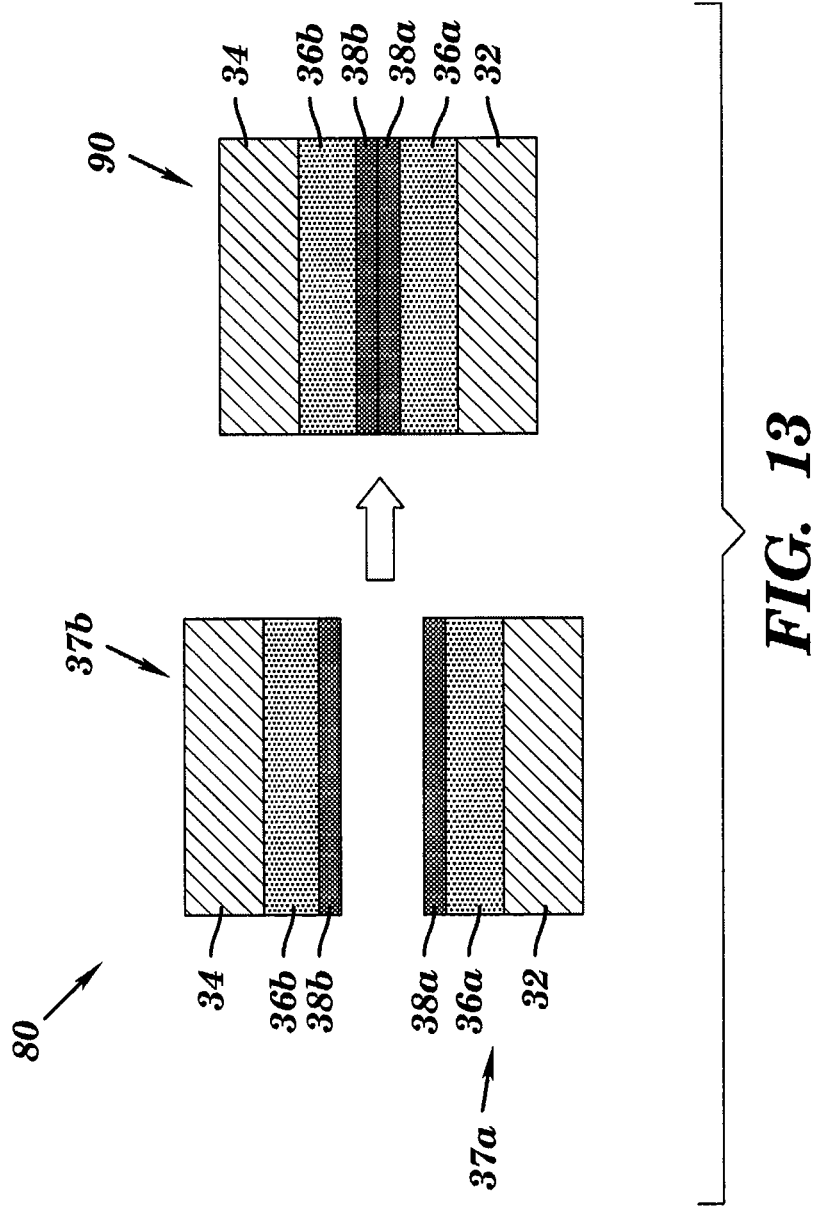
FIG. 13 is a schematic diagram of another process for fabricating a passive electrical device according to an aspect of the invention.

FIG. 13 is a schematic diagram of another process 80 for fabricating a passive electrical device 90 according to an aspect of the invention. As shown in FIG. 13, process 80 includes two double-coated laminate structure 37a and 37b (which may be similar to or identical to laminate structure 37 described above). Structure 37a includes conductor 32, a first layer 36a (which may be similar to or identical to first layer 36 described above), and second layer 38a (which may be similar to or identical to second layer 38 described above). Structure 37b includes conductor 34, a first layer 36b (which may be similar to or identical to first layer 36 described above), and second layer 38b (which may be similar to or identical to second layer 38 described above). According to this aspect, laminate structures 37a and 37b may be laminated together under temperature and pressure, as discussed above, with contact between second layer 38a and 38b to produce laminated passive electrical device 90. Aspects of the invention include process 80 and passive electrical device 90 having four dielectric layers, for example, four distinct dielectric layers 36a, 38a, 38b, and 36b, positioned between conductors, for example, foil conductors, 32 and 34.

EXAMPLES

The following description presents one typical method of fabricating a passive electrical device according to an aspect of the present invention and a typical passive electrical device according to an aspect of the invention.

A roll of electrodeposited copper foil having a thickness of 35 microns and a width of 60 cm is mounted on an unwinding roller of a coating machine, for example, a die coating machine. The foil is threaded through tensioning rollers and into an oven through idler rollers and then onto rewind rollers. The foil is tensioned to about 0.7 kg per centimeter. The temperatures of the air in a 3-zone oven drier are typically kept at 80 degrees C., 120 degrees C., and 160 degrees C., respectively, and the temperatures are allowed to stabilize.

A drive motor is engaged on the rewind roller and the line speed of the foil is set to 2 meters/minute. A solution of polyamideimide (PAI) polymer having high heat distortion temperature or softening point of about 260 degrees C. (measured by TMA) in a dimethylacetamide (DMAc) solvent is prepared for coating on the foil. The gap between a coating die and the foil is adjusted to produce a dried (that is, substantially totally cured) polymer layer of a desired thickness. The polymer solution feed pump pressure and flow of solution is maintained in the coating die to produce a constant film thickness. The solvent is evaporated off and the resin is dried, for example, substantially completely dried, to form a hard resin layer, for example, a first layer 36, of 10 µm thickness on the foil, for example, conductor 32. A roll of the dielectric coated foil or resin coated foil, for example, resin coated foil 35, is produced. A sample of dielectric coated foil is taken to measure coating thickness. The coating thickness is measured by subtracting foil thickness from total coated foil thickness.

Next, the roll of resin-coated foil is coated with a second layer of dielectric, for example, the second layer 38, on top of the first layer of dielectric, for example, the first layer 36. A second solution of a epoxy thermosetting polymer having adhesive/bonding characteristics under lamination condition and a methylethyl ketone (MEK) is produced. The second solution is applied on the resin side, that is, the first layer 36, of the resin-coated foil 37 in manner similar to that described above to obtain a desired thickness of the polymer. This second layer is partially cured (that is, to provide a "b-stage" laminate) so that it can subsequently be bonded, for example, via cross linking, with other substrates, including a second conductor 34 (as shown in FIG. 11), a first polymer layer 36b ( as shown in FIG. 12), or another second polymer layer 38b (as shown in FIG. 13). The temperature and coating conditions are adjusted to obtain a partially cured second polymer layer thickness of about 2.5 µm.

In one aspect of the invention, a capacitive devices may be formed by laminating two pieces of this coated foil, each laminate piece having a construction of copper-foil/first polymer layer/second polymer layer, for example, as illustrated by laminates 37a and 37b shown in FIG. 13, in such a way that the second polymer layer (38a, 38b) of each substrate facing each other. The lamination process produces a multilayer structure comprising copper foil/first polymer layer/second polymer layer/second polymer layer/first polymer layer/copper foil, for example, as shown by laminate 90 in FIG. 13. Lamination process is practiced in a hydraulic press at 190 degrees C. (374 degrees F.) and 22.5 kg/cm$^2$(320 psi) for a 90-minute dwell time and under vacuum of 74 cm (29 inches) of Hg.

The capacitor laminate produced is cut to size and processed to impart the desired pattern in the copper layer. The resulting capacitor is visually inspected and electrically tested at 500 volts (V) and found to have no shorting. The resulting capacitor will have a capacitance density of at least about 50 picoFarads per square centimeter ($pF/cm^2$), for example, at least about 130 $pF/cm^2$, and a dielectric strength of at least about 200 kiloVolts per millimeter (kV/mm).

Figure 14:
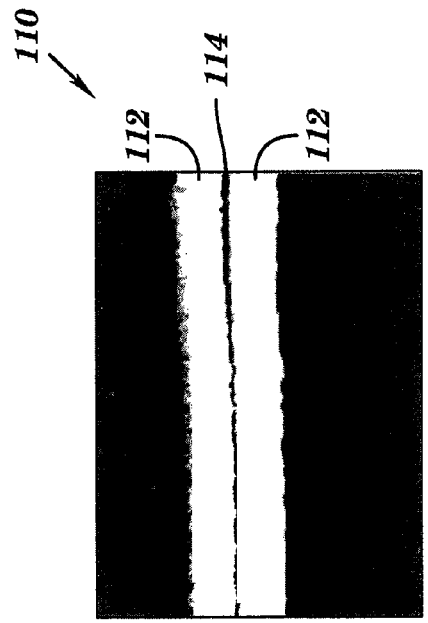
FIG. 14 is a photomicrograph of a cross section of a laminate structure according to one aspect of the invention.
Figure 15:
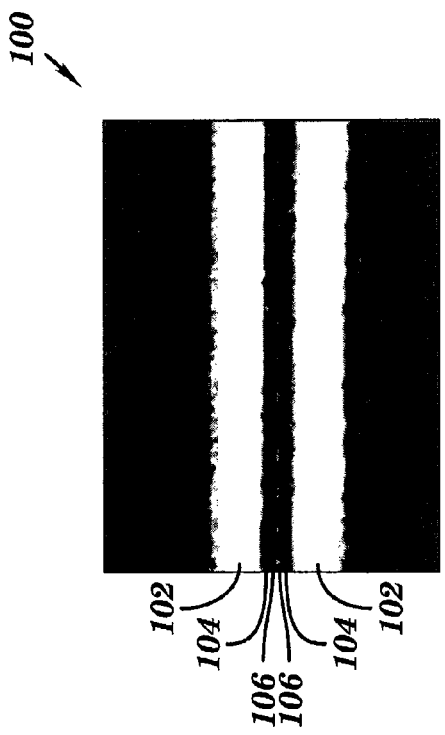
FIG. 15 is a photomicrograph of a cross section of a laminate structure according to the prior art.

FIG. 14 is a photomicrograph of a cross section of a laminate structure 100 according to one aspect of the invention, for example, as illustrated in the process shown in FIG. 13. FIG. 15 is a photomicrograph of a cross section of a laminate structure 110 according to the prior art. Both structures 100 and 110 were formed by a lamination process under a pressure of 320 psi, a temperature of 190 degrees C., a lamination dwell time of 90 minutes, and a vacuum of 29 inches of Hg. As shown in FIG. 14, laminate structure 100 includes two copper conductors 102 and a dielectric comprising a two layers of a first material 104, PAI, having a high softening point temperature of 260 degrees C. and two layers of a second material 106, epoxy resin, having a low softening point temperature of less than 150 degrees C. prior to lamination. As shown in FIG. 15, laminate structure 110 includes two copper conductors 112 and a dielectric comprising a single layer of a material 114, an epoxy resin, having a low softening point temperature of less than 150 degrees C. prior to lamination.

Comparison of FIGS. 14 and 15 illustrates how thin the resulting dielectric material 114 can become during processing according to the prior art compared to an aspect of the invention. With respect to FIG. 15, since material 114 has a softening point less than the lamination temperature of 190 degrees, the material 114 is soft and fluid during lamination temperature and pressure whereby material 114 thins out and results in a markedly thinner barrier to conductor 112 contact and shorting. The inventors have found that this disadvantage of the prior art is not remedied by increasing the thickness of the material 114. The resulting thinning illustrated in FIG. 15 characterizes the behavior of substantially all materials of lower softening point during lamination at a higher temperature. In contrast, as shown in FIG. 14, though the low softening point material 106 also tends to thin during processing, the higher softening point material 104 does not appreciably thin during processing whereby a thicker barrier to contact and shorting between conductors 102 is provided. Close examination of FIGS. 14 and 15 indicates that the conductors 102 in structure 100 according to aspects of the present invention have little or no likelihood of shorting, while conductors 112 of structure 110 show repeated evidence of shorting across the dielectric 114.

Figure 16:
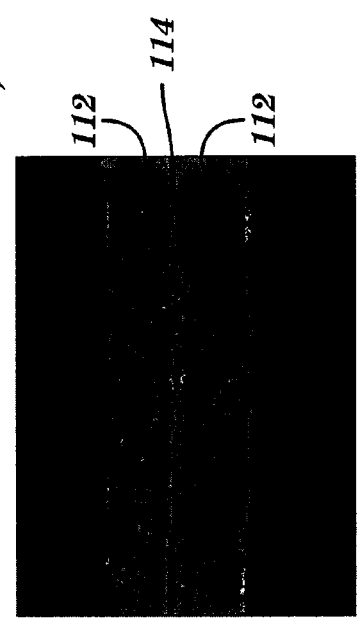
FIG. 16 is an SEM photograph of a detail of the laminate structure shown in FIG. 14.
Figure 17:
FIG. 17 is an SEM photograph of a detail of the laminate structure shown in FIG. 15.

FIG. 16 is an SEM photograph of a detail 120 of the laminate structure 100 shown in FIG. 14. FIG. 17 is an SEM photograph of a detail 130 of the laminate structure 110 shown in FIG. 15. As shown in FIG. 16, laminate structure 120 includes two copper conductors 102 and two polymer layers 104, and two polymer layers 106. As clearly shown in FIG. 16, according to one aspect of the invention, there is no contact between conductors 102 that could cause an electrical short. As shown in FIG. 17, laminate structure 130 includes two copper conductors 112 and a dielectric polymer layer 114. Close examination of FIG. 17, according to the prior art, indicates that the conductors 112 in structure 110 show repeated evidence of shorting across the dielectric 114.

It will be apparent to those of skill in the art from the above description that aspects of the present invention provide improved methods of fabricating passive electrical devices and improved passive electrical devices providing improved electrical performance, specifically, having reduced likelihood of shorting under electrical load. The improved passive electrical device may be used in any electrical application where thin laminar electrical device are typically found, for example, as discrete devices or one or more devices embedded in printed circuit boards and the like. Aspects of the invention may be coupled with or embedded within electrical circuits, printed circuit boards, or electrical devices, for example, microelectronic devices, such as chip packages, cell phones, personal digital assistants (PDAs), computer network servers, other electrical devices, and the like. In one aspect, the passive electrical device may be rigid or flexible. As will be appreciated by those skilled in the art, features, characteristics, and/or advantages of the various aspects described herein, may be applied and/or extended to any embodiment (for example, applied and/or extended to any portion thereof).

Although several aspects of the present invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

We claim:

1. A thin laminate capacitive device comprising:
a first conductor;
a first layer of a first insulating material adjacent to the first conductor, the first insulating material of the first layer having a softening point temperature greater than a lamination temperature of the device;
a first layer of a second insulating material adjacent to the first layer of the first insulating material, the second insulating material being different from the first insulating material, having a lower thermal deformation resistance than the first insulating material, and having a softening point temperature less than the lamination temperature of the device, wherein the lamination temperature of the device is 150 degrees C.; and
a second conductor adjacent the first layer of the second insulating material.

2. A thin laminate capacitive device comprising:
a first conductor;
a first layer of a first insulating material adjacent to the first conductor, the first insulating material of the first layer having a softening point temperature greater than a lamination temperature of the device;
a first layer of a second insulating material adjacent to the first layer of the first insulating material, the second insulating material being different from the first insulating material, having a lower thermal deformation resistance than the first insulating material, and having a softening point temperature less than the lamination temperature of the device, wherein the lamination temperature of the device is at least 200 degrees C.; and
a second conductor adjacent the first layer of the second insulating material.

3. The thin laminate capacitive device as recited in claim 2, wherein the capacitive device comprises a capacitance density of at least 50 $pF/cm^2$ and a dielectric strength of at least 200 kV/mm.

4. The thin laminate capacitive device as recited in claim 2, wherein the device further comprises a second layer of the first insulating material between the first layer of the second insulating material and the second conductor.

5. The thin laminate capacitive device as recited in claim 4, wherein the device further comprises a second layer of the second insulating material between the first layer of the second insulating material and the second conductor.

6. The thin laminate capacitive device as recited in claim 2, wherein the second conductor is laminated to the first layer of the second insulating material at the lamination temperature of the device.

7. The thin laminate capacitive device as recited in claim 2, wherein the first insulating material comprises at least one of a thermoplastic polymer and a thermosetting polymer.

8. The thin laminate capacitive device as recited in claim 2, wherein the first insulating material comprises a polymer comprising at least one of a polyamide, a polyamide-imide, a polyimide, a polymer sulphones, a polyaryl sulfone, a polyphenylene sulfide, a polyetheretherketone, a polyphenyleneoxide, a polybismalimide, an epoxy, a polyester, and a polyurethane.

9. The thin laminate capacitive device as recited in claim 2, wherein the second insulating material comprises a polymer comprising at least one of an epoxy, a polyimide, a polyamides, a polyamideimide, a polyethersulfone, a polyester, a polybismalemide, an alkyd, a polyurethane, and a bismalemide triazine.

10. The thin laminate capacitive device as recited in claim 2,
wherein the first conductor is a first copper foil conductor, the second conductor is a second copper foil conductor, the first insulating material is a first polymer having a softening point temperature greater than 150 degrees C., and the second insulating material is a second polymer having a softening point temperature less than 150 degrees C.;
wherein the first layer of the first polymer is bonded to the first copper foil conductor, the first layer of the second polymer is bonded to the first layer of the first polymer, and the second copper foil is bonded to the first layer of the second polymer; and
wherein the capacitive device comprises a capacitance density of at least 50 pF/cm$^2$ and a dielectric strength of at least 200 kV/mm.

11. The thin laminate capacitive device as recited in claim 10, wherein the second polymer comprises at least one of an epoxy, a polyimide, a polyamides, a polyamideimide, a polyethersulfone, a polyester, a polybismalemide, an alkyd, a polyurethane, and a bismalemide triazine.

12. The thin laminate capacitive device as recited in claim 2, wherein the first polymer comprises at least one of a polyamide, a polyamide-imide, a polyimide, a polymer sulphones, a polyaryl sulfone, a polyphenylene sulfide, a polyetheretherketone, a polyphenyleneoxide, a polybismalimide, an epoxy, a polyester, and a polyurethane.

13. A printed circuit board having the thin laminate capacitive device recited in claim 2.

14. An electronic device having the printed circuit board recited in claim 13.

15. The thin laminate capacitive device as recited in claim 2, wherein the first insulating material comprises a polyamide.

16. The thin laminate capacitive device as recited in claim 2, wherein the first insulating material comprises a polyamideimide polymer, and the second insulating material comprises an epoxy thermosetting polymer.

* * * * *